(12) United States Patent
Shimizu et al.

(10) Patent No.: US 10,103,723 B2
(45) Date of Patent: Oct. 16, 2018

(54) DRIVING APPARATUS FOR SWITCHES

(71) Applicant: DENSO CORPORATION, Kariya, Aichi-pref. (JP)

(72) Inventors: Hiroshi Shimizu, Kariya (JP); Kengo Mochiki, Kariya (JP); Yuu Yamahira, Kariya (JP); Tetsuya Matsuoka, Kariya (JP); Kazuma Fukushima, Kariya (JP); Mitsunori Kimura, Kariya (JP); Yasuyuki Ohkouchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/815,202

(22) Filed: Nov. 16, 2017

(65) Prior Publication Data

US 2018/0145672 A1    May 24, 2018

(30) Foreign Application Priority Data

Nov. 21, 2016  (JP) .................. 2016-225773

(51) Int. Cl.
| | |
|---|---|
| *H03K 17/14* | (2006.01) |
| *H03K 17/0412* | (2006.01) |
| *H03K 17/12* | (2006.01) |
| *H03K 17/082* | (2006.01) |
| *H03K 17/16* | (2006.01) |
| *H02M 1/00* | (2006.01) |
| *H03K 17/08* | (2006.01) |

(52) U.S. Cl.
CPC . *H03K 17/04126* (2013.01); *H03K 17/04123* (2013.01); *H03K 17/0822* (2013.01); *H03K 17/122* (2013.01); *H03K 17/14* (2013.01); *H03K 17/161* (2013.01); *H02M 2001/007* (2013.01); *H02M 2001/0048* (2013.01); *H03K 2017/0806* (2013.01)

(58) Field of Classification Search
None
See application file for complete search history.

(56) References Cited

U.S. PATENT DOCUMENTS

| | | | |
|---|---|---|---|
| 7,521,985 B2* | 4/2009 | Ball | H01L 23/34 327/512 |
| 7,579,900 B2* | 8/2009 | Durbaum | H03K 17/0822 327/404 |
| 8,604,841 B2* | 12/2013 | Lobsiger | H02M 1/088 327/108 |
| 9,046,912 B1* | 6/2015 | Liu | G05F 1/625 |

FOREIGN PATENT DOCUMENTS

JP    2007-110870 A    4/2007

* cited by examiner

*Primary Examiner* — Jeffrey Zweizig
(74) *Attorney, Agent, or Firm* — Oliff PLC

(57) ABSTRACT

In a driving apparatus for switches connected in parallel to each other, drivers respectively turn on or off the switches. A temperature obtainer obtains a value of a temperature parameter correlating with a temperature of at least one of the first and second switches. A selector selects at least one of the switches as at least one drive target switch. A driver causes at least one of the drivers to turn on the at least one drive target switch during an on duration and thereafter turn off the at least one drive target switch in each target switching cycle. The selector adjusts the number of the selected at least one drive target switch based on the value of the temperature parameter.

9 Claims, 8 Drawing Sheets

DRIVING APPARATUS FOR SWITCHES

CROSS REFERENCE TO RELATED APPLICATIONS

This application is based on and claims the benefit of priority from Japanese Patent Application 2016-225773 filed on Nov. 21, 2016, the disclosure of which is incorporated in its entirety herein by reference.

TECHNICAL FIELD

The present disclosure relates to driving apparatuses for switches connected in parallel to each other.

BACKGROUND

For example, Japanese Patent Application Publication No. 2007-11087 discloses such a driving apparatus for driving switches connected in parallel to each other.

SUMMARY

An increase in temperature of a switch may result in an increase in the on resistance of the switch. For this reason, an increase in the frequency of switching operations of a specified switch in the parallely-connected switches results in an increase in temperature of the specified switch, resulting in an increase in conduction loss of the specified switch based on its on resistance. There is therefore room for improvement in driving switches connected in parallel to each other.

In view of the circumstances set forth above, an exemplary aspect of the present disclosure seeks to provide driving apparatuses for switches connected in parallel to each other, each of which is capable of preventing an increase in conduction loss of a specified switch in the parallely-connected switches.

According to a first exemplary aspect of the present disclosure, there is provided a driving apparatus for a plurality of switches connected in parallel to each other. The driving apparatus includes a plurality of drivers configured to turn on or off the respective switches, and a temperature obtainer configured to obtain a value of a temperature parameter correlating with a temperature of at least one of the switches. The driving apparatus includes a selector configured to select at least one of the switches as at least one drive target switch. The driving apparatus includes a drive controller configured to cause at least one of the drivers to turn on the at least one drive target switch during a predetermined on duration and thereafter turn off the at least one drive target switch in each target switching cycle. The target switching cycle, such as, the target switching frequency, is defined as a product of a reference switching cycle and the number of the selected at least one drive target switch. The selector is configured to adjust the number of the selected at least one drive target switch in accordance with the value of the temperature parameter.

In a second exemplary aspect of the present disclosure, the drivers include at least first and second drivers, and the selector is configured to select a first switch and a second switch in the switches as first and second drive target switches constituting the at least one drive target switch. The drive controller is configured to turn on the first drive target switch during a predetermined first on duration as the on duration and thereafter turn off the first drive target switch in each target switching cycle. The drive controller is also configured to cause the second driver to turn on the second drive target switch during a predetermined second on duration as the on duration and thereafter turn off the second drive target switch in each target switching cycle while the first on duration of the first drive target switch is nonoverlapped with the second on duration of the second drive target switch.

The selector of each of the first and second exemplary aspects of the present disclosure adjusts the number of the selected at least one drive target switch in accordance with the value of the temperature parameter.

This prevents a specified switch in the switches from being intensively turned on or off to thereby hold down an increase of the temperature of the specified switch, thus holding down an increase of the on resistance of the specified switch. This therefore results in lower conduction loss of the switches.

In a third exemplary aspect of the present disclosure, the selector is configured to determine whether the value of the temperature parameter is higher than a temperature threshold, and increase the number of the selected at least one drive target switch upon determination that the value of the temperature parameter is higher than the temperature threshold.

An increase in the number of the selected at least one drive target switch results in decrease in the temperature of the selected at least one drive target switch, resulting in reduction in conduction loss generated from the at least one drive target switch.

In a fourth exemplary aspect of the present disclosure, the selector is configured to determine whether the value of the temperature parameter is lower than a reference temperature, the reference temperature being set to be lower than the temperature threshold, and decrease the number of the selected at least one drive target switch upon determination that the value of the temperature parameter is equal to or lower than the reference temperature.

A decrease in the number of the selected at least one drive target switch results in reduction in conduction loss generated from the switches.

In a fifth exemplary aspect of the present disclosure, the switches include at least first, second, third, and fourth switches connected in parallel to each other, and the at least first, second, third, and fourth switches are separated into a first group of the first and second switches, and a second group of the third and fourth switches. The drivers include at least first, second, third, and fourth drivers. The selector is configured, upon determination that the value of the temperature parameter is higher than the temperature threshold while the number of the selected at least one drive target switch has reached an upper limit, to select the first and second switches of the first group as first and second drive target switches, and the third and fourth switches of the second group as third and fourth drive target switches, the first to fourth drive target switches constituting the at least one drive target switch. The target switching cycle is defined as the product of the reference switching cycle and the number of the selected switches in each of the first and second groups. The drive controller is configured to (1) Cause each of the first and second drivers to turn on the corresponding one of the first and second drive target switches during a corresponding one of the first and second on durations as the on duration and thereafter turn off the corresponding one of the first and second drive target switches in each target switching cycle (2) Cause each of the third and fourth drivers to turn on the corresponding one of the third and fourth drive target switches during a corresponding one of predetermined third and fourth on durations as the on duration and thereafter turn off the corresponding one of the third and fourth drive target switches in each target switching cycle such that each of the first and second on durations of the first group is nonoverlapped with each of the third and fourth on durations of the second group.

This configuration enables a predetermined current to be distributed to flow through both the first and second switches in the first group, and the predetermined current to be distributed to flow through both the third and fourth switches in the second group. This reduces the level of the distributed current flowing through each of the first to fourth switches as compared with the level of the predetermined current flowing concentrically through one of the first to fourth switches. This therefore reduces the temperature of each of the first to fourth switches to be equal to or lower than the temperature threshold, thus reducing conduction loss generated from each of the first to fourth switches. Additionally, the fifth exemplary aspect results in reduction in switching loss as compared with the comparative structure that all the first to fourth switches are simultaneously turned on or off in each target switching cycle.

In a sixth exemplary aspect of the present disclosure, a plurality of temperature ranges different from each other are defined as determination temperature ranges. The selector is configured to (1) Periodically perform a determination task that determines one of the determination temperature ranges to which the value of the temperature parameter belongs (2) Determine whether one of the determination temperature ranges to which the value of the temperature parameter belongs determined in a current determination task is higher than one of the determination temperature ranges to which the value of the temperature parameter belongs determined in a previous determination task (3) Increase the number of the at least one drive target switch selected upon determination that one of the determination temperature ranges to which the value of the temperature parameter belongs determined in the current determination task is higher than one of the determination temperature ranges to which the value of the temperature parameter belongs determined in the previous determination task (4) Decrease the number of the at least one drive target switch selected upon determination that one of the determination temperature ranges to which the value of the temperature parameter belongs determined in the current determination task is lower than one of the determination temperature ranges to which the temperature of one of the first and second switches belongs determined in the previous determination task.

This increases or decrease the number of the selected at least one drive target switch depending on whether one of the determination temperature ranges to which the temperature parameter belongs determined in the current determination task is higher than one of the determination temperature ranges to which the temperature parameter belongs determined in the previous determination task. This prevents a specified switch in the switches from being intensively turned on or off to thereby hold down an increase of the temperature of the specified switch, thus holding down an increase of the on resistance of the specified switch. This therefore results in lower conduction loss of the switches.

In a seventh exemplary aspect of the present disclosure, the switches include at least first, second, third, and fourth switches connected in parallel to each other, and the at least first, second, third, and fourth switches are separated into a first group of the first and second switches, and a second group of the third and fourth switches. The drivers include at least first, second, third, and fourth drivers, and an upper limit of the highest temperature range in the determination temperature ranges is defined as the temperature threshold.

The selector is configured, upon determination that the value of the temperature parameter is higher than the temperature threshold, to select the first and second switches of the first group as first and second drive target switches, and the third and fourth switches of the second group as third and fourth drive target switches. The first to fourth drive target switches constitute the at least one drive target switch, and the target switching cycle is defined as the product of the reference switching cycle and the number of the selected switches in each of the first and second groups.

The drive controller is configured to (1) Cause each of the first and second drivers to turn on the corresponding one of the first and second drive target switches during a corresponding one of the first and second on durations as the on duration and thereafter turn off the corresponding one of the first and second drive target switches in each target switching cycle (2) Cause each of the third and fourth drivers to turn on the corresponding one of the third and fourth drive target switches during a corresponding one of predetermined third and fourth on durations as the on duration and thereafter turn off the corresponding one of the third and fourth drive target switches in each target switching cycle while each of the first and second on durations of the first group is nonoverlapped with each of the third and fourth on durations of the second group.

This configuration enables a predetermined current to be distributed to flow through both the first and second switches in the first group, and the predetermined current to be distributed to flow through both the third and fourth switches in the second group. This reduces the level of the distributed current flowing through each of the first to fourth switches as compared with the level of the predetermined current flowing intensively through one of the first to fourth switches. This therefore reduces the temperature of each of the first to fourth switches to be equal to or lower than the temperature threshold, thus reducing conduction loss of each of the first to fourth switches. Additionally, the seventh exemplary aspect results in reduction in switching loss as compared with the comparative structure that all the first to fourth switches are simultaneously turned on or off in each target switching cycle.

The driving apparatus according to an eighth exemplary aspect of the present disclosure further includes a plurality of power supply circuits for supplying electrical power to the respective drivers, and a power-supply controller configured to cause at least one of the power supply circuits to supply the electrical power to only at least one of the drivers corresponding to the at least one drive target switch. The drive controller is configured to cause the at least one of the drivers to which the electrical power is supplied from the at least one of the power supply circuits to turn on or turn off the corresponding at least one drive target switch.

If all the power supply circuits supplied electrical power to the respective drivers while at least one of the switches is unselected as the at least one drive target switch, standby power of unselected driver(s) corresponding to the unselected switch(es) would go to waste.

From this viewpoint, the power-supply controller according to the eight exemplary aspect is configured to cause at least one of the power supply circuits to supply the electrical power to only at least one of the drivers corresponding to the at least one drive target switch. This configuration therefore results in lower power consumption of the drivers while holding down an increase of the temperature of the at least one drive target switch.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more features of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
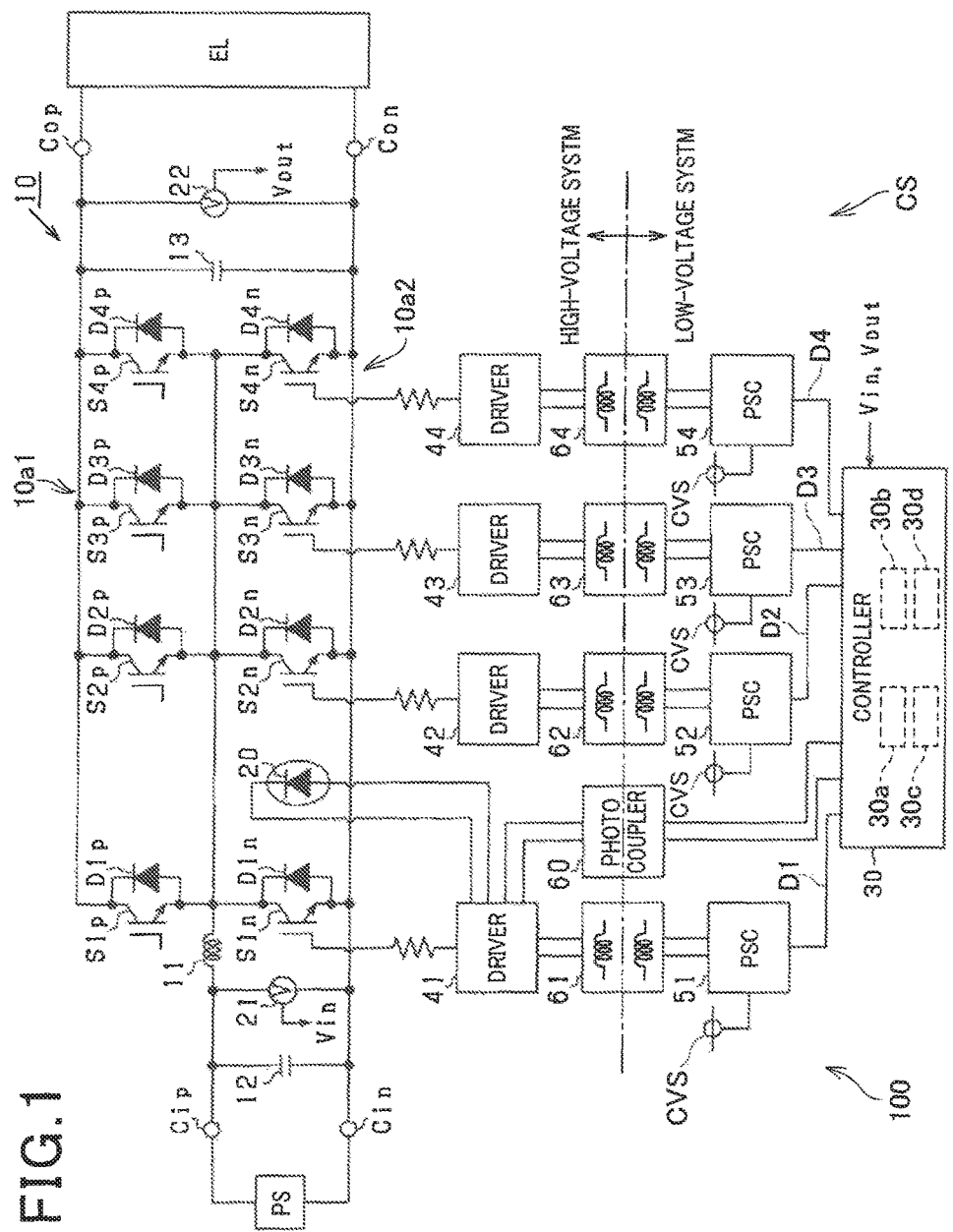
FIG. 1 is a circuit diagram schematically illustrating an overall configuration of a power conversion system according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description. First, the following describes a power conversion system CS including a driving apparatus according to the first embodiment of the present disclosure with reference to the accompanying drawings.

Referring to FIG. 1, the power conversion system CS is installed in, for example, a vehicle. The power conversion system CS includes a voltage converter, which is an example of a booster converter, 10 and a control system 100 for controlling the booster converter 10.

The booster converter 10 is designed as, for example, a chopper booster, and operative to boost an output voltage from a direct-current (DC) power source PS, such as a battery, and output the boosted voltage to at least one electrical load EL, such as an inverter. The DC power source PS has opposite positive and negative terminals.

The booster converter 10 has a positive input terminal Cip, a negative input terminal Cin, a positive output terminal Cop, and a negative output terminal Con. The booster converter 10 includes, for example, an inductor, i.e. a reactor, 11 and a first capacitor 12. The inductor 11 has opposing first and second ends, and the first capacitor 12 has opposing first and second electrodes, i.e. first and second ends.

The first end of the inductor 11 is connected to the positive terminal of the DC power source PS via the positive input terminal Cip. The first electrode of the first capacitor 12 is connected to the positive input terminal Cip, and the second electrode of the first capacitor 12 is connected to the negative terminal of the DC power source PS via the negative input terminal Cin. This results in the first capacitor 12 being connected in parallel to the DC power source PS.

The booster converter 10 includes a first parallel connection assembly 10a1 comprised of first to fourth upper-arm switches S1$p$, S2$p$, S3$p$, and S4$p$. The booster converter 10 also includes a second parallel connection assembly 10a2 comprised of first to fourth lower-arm switches S1$n$, S2$n$, S3$n$, and S4$n$.

The first upper-arm switch S1$p$ and the first lower-arm switch S1$n$ are connected in series to each other, and the second upper-arm switch S2$p$ and the second lower-arm switch S2$n$ are connected in series to each other. Similarly, the third upper-arm switch S3$p$ and the third lower-arm switch S3$n$ are connected in series to each other, and the fourth upper-arm switch S4$p$ and the fourth lower-arm switch S4$n$ are connected in series to each other.

The booster converter 10 further includes free-wheel diodes or flywheel diodes D1$p$, D2$p$, D3$p$, D4$p$, D1$n$, D2$n$, D3$n$, and D4$n$ connected antiparallel to the respective switches S1$p$, S2$p$, S3$p$, S4$p$, S1$n$, S2$n$, S3$n$, and S4$n$.

For example, the first embodiment uses IGBTs, as an example of semiconductor switches, as the upper- and lower-arm switches S1$p$, S2$p$, S3$p$, S4$p$, S1$n$, S2$n$, S3$n$, and S4$n$. MOSFETs or bipolar transistors can also be used as the upper- and lower-arm switches S1$p$, S2$p$, S3$p$, S4$p$, S1$n$, S2$n$, S3$n$, and S4$n$. If MOSFETs are individually used as the upper- and lower-arm switches S1$p$, S2$p$, S3$p$, S4$p$, S1$n$, S2$n$, S3$n$, and S4$n$, intrinsic diodes of the MOSFETs can be used as the flywheel diodes.

The connection point between the first upper- and lower-arm switches S1$p$ and S1$n$ and the connection point between the second upper- and lower-arm switches S2$p$ and S2$n$ are connected to the second end of the inductor 11. Similarly, the connection point between the third upper- and lower-arm switches S3$p$ and S3$n$ and the connection point between the fourth upper- and lower-arm switches S4$p$ and S4$n$ are connected to the second end of the inductor 11.

The collectors of the first to fourth upper-arm switches S1$p$ to S4$p$ are connected to the positive output terminal Cop of the booster converter 10. The emitters of the first to fourth lower-arm switches S1$n$ to S4$n$ are connected to both the negative input and output terminals Cin and Con of the booster converter 10 via a common signal ground line.

The booster converter 10 includes a second capacitor 13. The second capacitor 13 has opposing first and second electrodes, i.e. first and second ends. The first end of the second capacitor 13 is connected to the positive output terminal Cop of the booster converter 10, and the second end of the second capacitor 13 is connected to the negative output terminal Con of the booster converter 10. That is, the second capacitor 13 is connected in parallel to the pair of first upper- and lower-arm switches (S 1p, S1n), the pair of second upper- and lower-arm switches (S2p, S2n), the pair of third upper- and lower-arm switches (S3p, S3n), and the pair of fourth upper- and lower-arm switches (S4p, S4n).

The at least one electrical load EL is connected to the positive and negative output terminals Cop and Con of the booster converter 10 such that the voltage boosted by the booster converter 10 is supplied to the at least one electrical load EL. The first embodiment uses an inverter as an example of an electrical load; the inverter converts the DC voltage boosted by the booster converter 10 into an alternating-current (AC) voltage, and outputs the AC voltage to, for example, an unillustrated motor connected thereto. The unillustrated motor is driven based on the AC voltage to output torque.

The control system 100 includes a temperature sensor 20, an input voltage sensor 21, an output voltage sensor 22, and a controller 30. The temperature sensor 20 is comprised of, for example, a temperature-sensitive diode 20a. For example, the temperature sensor 20 is disposed to be close to, for example, the first lower-arm switch S1n as a temperature detection target. For example, the switches S1p to S4n are mounted to a chip, and the temperature sensor 20 is also mounted to the same chip.

Specifically, the temperature sensor 20 is configured to measure the temperature of the first lower-arm switch S1n, and output a temperature measurement signal indicative of the measured temperature to a first driver described later.

The input voltage sensor 21 is connected across the first capacitor 12 to serve as an input voltage measuring unit. Specifically, the input voltage sensor 21 is operative to measure the voltage across the first and second electrodes of the first capacitor 12 as an input voltage Vin to the booster converter 10. The input voltage sensor 21 is connected to the controller 30, and outputs the measured input voltage Vin to the controller 30.

The output voltage sensor 22 is connected across the second capacitor 13 to serve as an output voltage measuring unit. Specifically, the output voltage sensor 22 is operative to measure the voltage across the first and second electrodes of the second capacitor 13 as an output voltage Vout of the booster converter 10. The output voltage sensor 22 is connected to the controller 30, and outputs the measured output voltage Vout to the controller 30.

The controller 30 is connected to the input voltage sensor 21 and the output voltage sensor 22. The controller 30 receives the input voltage Vin to the booster converter 10 measured by the input voltage sensor 21 and the output voltage Vout of the booster converter 10 measured by the output voltage sensor 22.

The controller 30 is essentially comprised of at least one microcomputer circuit including, for example, a CPU, a ROM, a RAM, and other known peripheral devices. The CPU of the controller 30 runs software programs stored in, for example, the ROM to perform various tasks and/or routines. In particular, the CPU of the controller 30 runs at least one software program stored in, for example, the ROM to perform a drive routine described later to implement at least a temperature obtainer 30a, a selector 30b, a drive controller 30c, and a power-supply controller 30d.

These functional modules 30a, 30b, 30c, and 30d can each implemented by an electronic circuit, such as a hardware unit, or can be implemented by at least one digital circuit including many logic circuits, at least one analog circuit, or at least one analog and digital hybrid circuit.

The controller 30 performs a feedback control task in a booster mode, i.e, a step-up mode, to perform on on-off control of the first to fourth lower-arm switches S1n to S4n while maintaining the first to fourth upper-arm switches S1p to S4p in an off state. This feedback control task in the boosting mode causes the output voltage Vout of the booster converter 10 to follow a target voltage Vtgt.

Specifically, the controller 30 determines a duty factor, i.e. a duty or a duty cycle, Duty of each of the first to fourth lower-arm switches S1n to S4n as a function of the input voltage Vin, the output voltage Vout, and the target voltage Vtgt when controlling the booster converter 10 to operate in the booster mode.

The duty factor Duty of each of the first to fourth lower-arm switches S1n to S4n represents the ratio of on duration Lon to the total duration of each reference switching cycle Lsw for a corresponding one of the first to fourth lower-arm switches S1n to S4n; the duty factor Duty is expressed as Lon/Lsw. More specifically, the controller 30 increases the duty factor Duty of each of the first to fourth lower-arm switches S1n to S4n with an increase of the target voltage Vtgt.

The power control system 100 also includes first, second, third, and fourth drivers 41, 42, 43, and 44 provided for the respective first, second, third, and fourth switches S1n, S2n, S3n, and S4n. The control terminals, i.e. the gates, of the first to fourth lower-arm switches S1n to S4n are connected to the respective first to fourth drivers 41 to 44. The control terminals, i.e. the gates, of the first to fourth lower-arm switches S1n to S4n are connected to the respective first to fourth drivers 41 to 44. Each of the first to fourth drivers 41 to 44, which is comprised of, for example, an integrated circuit (IC), is configured to be driven based on electrical power externally supplied thereto.

The power control system 100 further includes first to fourth power supply circuits (PSC) 51, 52, 53, and 54, a photocoupler 60, and first to fourth transformers 61, 62, 63, and 64.

The first to fourth power supply circuits 51 to 54, each of which is comprised of, for example, an IC, are connected to the controller 30. Each of the first to fourth transformers 61 to 64 is comprised of a primary coil and a secondary coil magnetically couple to the primary coil when the primary coil is energized. The primary coil of each of the first to fourth transformers 61 to 64 is connected to the corresponding one of the first to fourth power supply circuits 51 to 54. The secondary coil of each of the first to fourth transformers 61 to 64 is connected to the corresponding one of the first to fourth drivers 41 to 44.

Specifically, the controller 30 generates drive signals D1, D2, D3, and D4 for the respective first to fourth lower-arm switches S1n, S2n, S3n, and S4n based on the determined duty factors Duty of the respective first to fourth switches S1n, S2n, S3n, and S4n. Then, the controller 30 sends the drive signals D1 to D4 to the respective first to fourth power supply circuits 51 to 54.

Each of the first to fourth power supply circuits 51 to 54 is connected to a corresponding one of constant voltage sources CVS.

The first power supply circuit 51 is configured to supply a constant voltage based on the corresponding constant voltage source CVS to the first transformer 61 in accordance with the drive signal D1 sent from the controller 30. The second power supply circuit 52 is configured to supply a constant voltage based on the corresponding constant voltage source CVS to the second transformer 62 in accordance with the drive signal D2 sent from the controller 30.

The third power supply circuit 53 is configured to supply a constant voltage based on the corresponding constant voltage source CVS to the third transformer 63 in accordance with the drive signal D3 sent from the controller 30. The fourth power supply circuit 54 is configured to supply a constant voltage based on the corresponding constant voltage source CVS to the fourth transformer 64 in accordance with the drive signal D4 sent from the controller 30.

Each of the first to fourth transformers 61 to 64 is configured to convert the constant voltage into a predetermined drive voltage for a corresponding one of the first to fourth lower-arm switches S1n to S4n while electrically isolating the corresponding transformer from the corresponding lower-arm switch. Then, each of the first to fourth transformers 61 to 64 is configured to apply the drive voltage to the control terminal, i.e. the gate, of the corresponding one of the first to fourth lower-arm switches S1n to S4n, thus driving the corresponding one of the first to fourth lower-arm switches S1n to S4n.

That is, the controller 30 controls the drive signals D1 to D4 to correspondingly control on-off switching operations of the first to fourth lower-arm switches S1n to S4n.

Note that, as described above, the first to fourth transformers electrically isolate the set of the booster converter 10 and the first to fourth drivers 61 to 64 from the set of the controller 30 and the first to fourth power supply circuits 51 to 54.

The set of the booster converter 10 and the first to fourth drivers 61 to 64 constitute a high-voltage system, because the input voltage Vin supplied from the DC power source PS is higher than the constant voltage supplied from each constant voltage source CVS. For the same reason, the set of the controller 30 and the first to fourth power supply circuits 51 to 54 constitute a low-voltage system. In other words, the power conversion system CS according to the first embodiment is configured such that the first to fourth transformers 61 to 64 electrically isolate the high- and low-voltage systems from each other.

Additionally, the temperature sensor 20 according to the first embodiment is connected to, for example, the first driver 41, so that the temperature sensor 20 is configured to output the temperature measurement signal indicative of the measured temperature of the first lower-arm switch S1n to the first driver 41.

The first driver 41 is connected to the photocoupler 60 that is an electrically isolation device, and the photocoupler 60 is connected to the controller 30.

Specifically, the first driver 41 is configured to convert the value of the measurement signal indicative of the measured temperature of the first lower-arm switch S1n into a digital temperature-measurement value. Then, the first driver 41 is configured to transfer the digital temperature-measurement value to the controller 30 via the photocoupler 60 while electrically isolating the first driver 41 from the controller 30. That is, the photocoupler 60 serves to transfer data between the high- and low-voltage systems while maintaining electrical isolation between the high- and low-voltage systems.

When receiving the digital temperature-measurement value via the photocoupler 60, the controller 30 obtains the digital temperature-measurement value as temperature information about the first lower-arm switch S1n, and calculates, as a temperature parameter indicative of the temperature of the first to fourth lower-arm switches S1n to S4n, a switch temperature Tsw1 of the first lower-arm switch S1n as a function of the temperature information.

Figure 2:
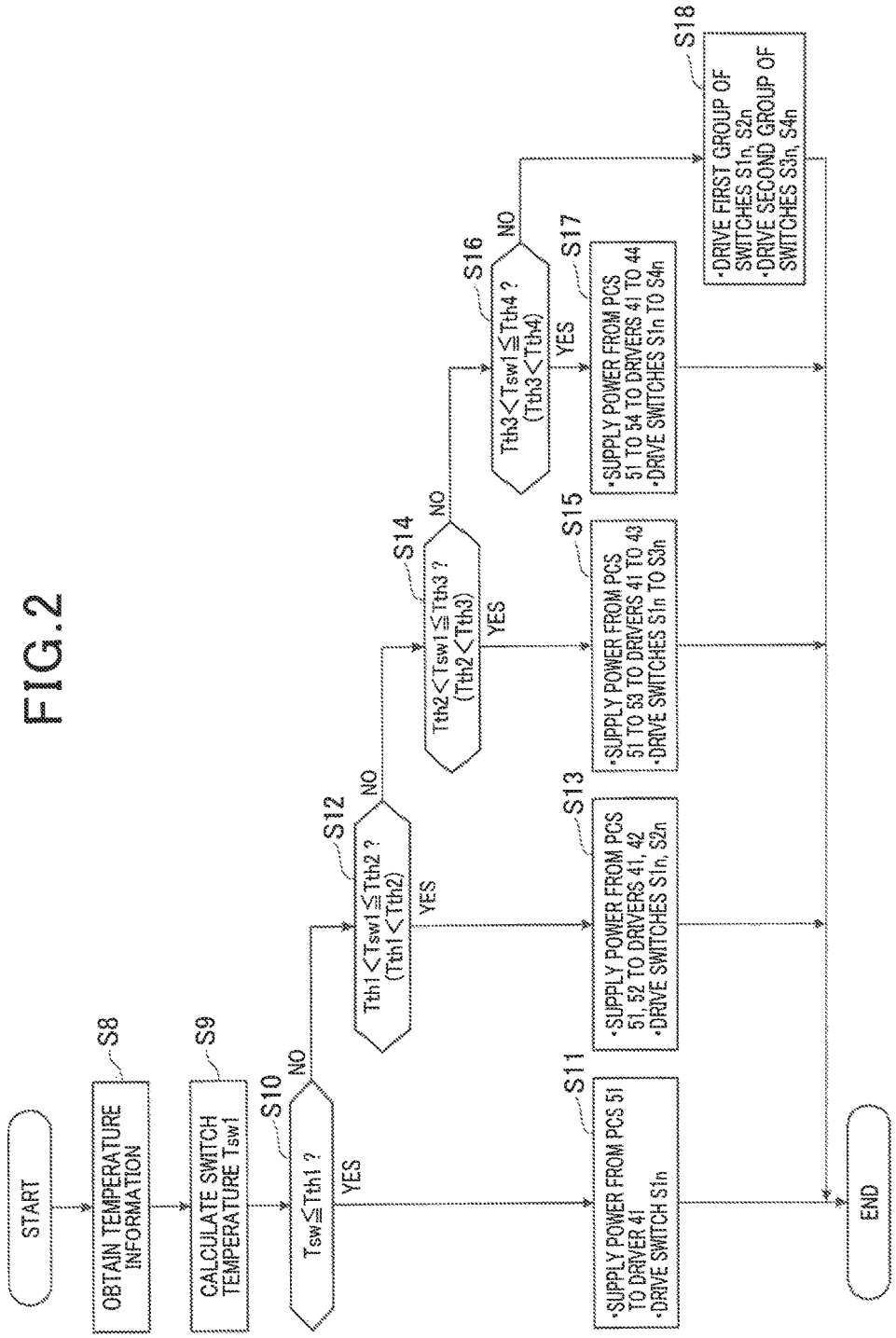
FIG. 2 is a flowchart schematically illustrating a drive routine carried out by a controller illustrated in FIG. 1.

Next, the following describes a drive routine for the first to fourth lower-arm switches S1n to S4n in the booster mode with reference to FIG. 2. The controller 30 is programmed to perform the drive routine in, for example, a predetermined period. In other words, the controller 30 serves as the temperature obtainer 30a, the selector 30b, the drive controller 30c, and the power-supply controller 30d set forth above to perform the following operations of the drive routine.

When starting the drive routine, the controller 30 serves as, for example, the temperature obtainer 30a to obtain, as the temperature information about the first lower-arm switch S1n, the digital-temperature measurement value indicative of the measured temperature of the first lower-arm switch S1n via the first driver 41 and the photocoupler 60 in step S8.

Next, the controller 30 serves as, for example, the temperature obtainer 30a to calculate the switch temperature Tsw1 of the first lower-arm switch S1n as a function of the temperature information.

Subsequently, the controller 30 serves as, for example, the selector 30b to determine whether the calculated switch temperature Tsw1 is equal to or lower than a first threshold Tth1 in step S10. Note that the temperature range defined from a predetermined allowable lower limit temperature of the first to fourth lower-arm switches S1n to S4n to the first threshold Tth1 inclusive is set as a first determination temperature range according to the first embodiment. The allowable lower limit temperature represents that, if the temperature of each of the first to fourth lower-arm switches S1n to S4n is maintained to be equal to or higher than the allowable lower limit temperature, the reliability of the corresponding one of the first to fourth lower-arm switches S1n to S4n is maintained.

Upon determination that the calculated switch temperature Tsw1 is equal to or lower than the first threshold Tth1 (YES in step S10), the controller 30 determines that the switch temperature Tsw1 calculated in the present drive routine belongs to the first determination temperature range. Then, the drive routine proceeds to step S11.

In step S11, the controller 30 serves as, for example, the selector 30b to select., from the first to fourth drivers 41 to 44, the first driver 41. Then, in step S11, the controller 30 serves as, for example, the power-supply controller 30d to cause the first power supply circuit 51 to supply the constant voltage to only the selected first driver 41. This results in the first driver 41 being activated, so that the first lower-arm switch S1n is selected as a drive target switch.

Figure 3:
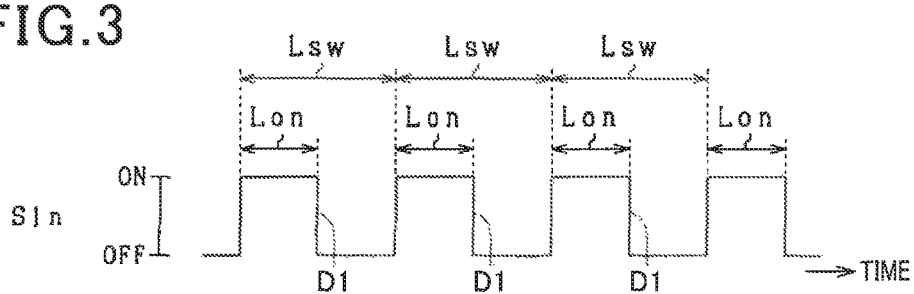
FIG. 3 is a timing chart schematically illustrating how a first lower-arm switch is driven over time.

Thereafter, the controller 30 serves as, for example, the drive controller 30c to control the first driver 41 via the first power supply circuit 51 to turn on only the first lower-arm switch S1n during the on duration Lon and turn off the first lower-arm switch S1n after lapse of the on duration Lon in each reference switching cycle Lsw (see FIG. 3).

Otherwise, upon determination that the calculated switch temperature Tsw1 is higher than the first threshold Tth1 (NO in step S10), the controller 30 serves as, for example, the selector 30b to determine whether the switch temperature Tsw1 is higher than the first threshold Tth1 and equal to or lower than a second threshold Tth2 in step S12; the second threshold Tth2 is set to be higher than the first threshold Tth1. Note that the temperature range defined from the first threshold Tth1 exclusive to the second threshold Tth2 inclusive is set as a second determination temperature range according to the first embodiment; the second determination temperature range is adjacent to the first determination temperature range.

Upon determination that the switch temperature Tsw1 is higher than the first threshold Tth1 and equal to or lower than the second threshold Tth2 (YES in step S12), the controller 30 determines that the switch temperature Tsw1 calculated in the present drive routine belongs to the second determination temperature range. Then, the drive routine proceeds to step S13.

In step 513, the controller 30 serves as, for example, the selector 30*b* to select, from the first to fourth drivers 41 to 44, the first and second drivers 41 and 42. Then, in step S13, the controller 30 serves as, for example, the power-supply controller 30*d* to cause the first and second power supply circuits 51 and 52 to supply the constant voltages to only the selected first and second drivers 41 and 42. This results in the first and second drivers 41 and 42 being activated, so that the first and second lower-arm switches S1*n* and S2*n* are each selected as a drive target switch.

Specifically, in step S13, the controller 30 serves as, for example, the drive controller 30*c* to control the first and second drivers 41 and 42 via the first and second power supply circuits 51 and 52 to 1. Turn on the first lower-arm switch S1*n* during the on duration Lon of the drive signal, i.e. drive pulse, D1 and turn off the first lower-arm switch S1*n* after lapse of the on duration Lon every two reference switching cycles, expressed as (2×Lsw) (see FIG. 4)

2. Turn on the second lower-arm switch S2*n* during the on duration Lon of the drive pulse D2 and turn off the second lower-arm switch S2*n* after lapse of the on duration Lon every two switching cycles (2×Lsw) while keeping one reference switching cycle Lsw between the on start timing of each drive pulse D1 and the on start timing of the drive pulse D2 adjacent to the corresponding drive pulse D1 (see FIG. 4)

In other words, the controller 30 alternately turns on the first lower-arm switch S1*n* and the second lower-arm switch S2*n* every two reference switching cycles (2×Lsw), so that the on duration of the first lower-arm switch S1*n* is nonoverlapped with the on duration of the second lower-arm switch S2*n*.

Otherwise, upon determination that the switch temperature Tsw1 is higher than the second threshold Tth2 (NO in step S12), the controller 30 serves as, for example, the selector 30*b* to determine whether the switch temperature Tsw1 is higher than the second threshold Tth2 and equal to or lower than a third threshold Tth3 in step S14; the third threshold Tth3 is set to be higher than the second threshold Tth2. Note that the temperature range defined from the second threshold Tth2 exclusive to the third threshold Tth3 inclusive is set as a third determination temperature range according to the first embodiment; the third determination. temperature range is adjacent to the second determination temperature range.

Upon determination that the switch temperature Tsw1 is higher than the second threshold Tth2 and equal to or lower than the third threshold Tth3 (YES in step S14), the controller 30 determines that the switch temperature Tsw1 calculated in the present drive routine belongs to the third determination temperature range. Then, the drive routine proceeds to step S15.

In step S15, the controller 30 serves as, for example, the selector 30*b* to select, from the first to fourth drivers 41 to 44, the first to third drivers 41 to 43. Then, in step S15, the controller 30 serves as, for example, the power-supply controller 30*d* to cause the first to third power supply circuits 51 to 53 to supply the constant voltages to only the selected first to third drivers 41 to 43. This results in the first to third drivers 41 to 43 being activated, so that the first to third lower-arm switches S1*n* to S3*n* are each selected as a drive target switch.

Specifically, in step S15, the controller 30 serves as, for example, the drive controller 30*c* to control the first to third drivers 41 to 43 via the first to third power supply circuits 51 to 53 to 1. Turn on the first lower-arm switch S1*n* during the on duration Lon of the drive pulse D I and turn off the first lower-arm switch S1*n* after lapse of the on duration Lon every three reference switching cycles, ex-pressed as (3×Law) (see FIG. 5)

2. Turn on the second lower-arm switch S2*n* during the on duration Lon of the drive pulse D2 and turn off the second lower-arm switch S2*n* after lapse of the on duration Lon every three switching cycles (3×Lsw) while keeping one reference switching cycle Lsw between the on start timing of each drive pulse D1 and the on start timing of the drive pulse D2 adjacent to the corresponding drive pulse D1 (see FIG. 5)

3. Turn on the third lower-arm switch S3*n* during the on duration Lon of the drive pulse D3 and turn off the third lower-arm switch S3*n* after lapse of the on duration Lon every three switching cycles (3×Lsw) while keeping one reference switching cycle Lsw between the on start timing of each drive pulse D2 and the on start timing of the drive pulse D3 adjacent to the corresponding drive pulse D2 (see FIG. 5)

In other words, the controller 30 alternately turns on the first lower-arm switch S1*n*, the second lower-arm switch S2*n*, and the third lower-arm switch S3*n* every three reference switching cycles (3×Lsw), so that the on duration of the first lower-arm switch S1*n*, the on duration of the second lower-arm switch S2*n*, and the on duration of the third lower-arm switch S3*n* are nonoverlapped with each other.

Otherwise, upon determination that the switch temperature Tsw1 is higher than the third threshold Tth3 (NO in step S14), the controller 30 serves as, for example, the selector 30*b* to determine whether the switch temperature Tsw1 is higher than the third threshold Tth3 and equal to or lower than a fourth threshold Tth4 in step S16; the fourth threshold Tth4 is set to be higher than the third threshold Tth3. Note that the temperature range defined from the third threshold Tth3 exclusive to the fourth threshold Tth4 inclusive is set as a fourth determination temperature range according to the first embodiment; the fourth determination temperature range is adjacent to the third determination temperature range. The fourth threshold Tth4 is for example set to be a predetermined allowable upper limit temperature, such as 150°C., of the first to fourth lower-arm switches S1*n* to S4*n*. The allowable upper limit temperature represents that, if the temperature of each of the first to fourth lower-arm switches S1*n* to S4*n* is maintained to be equal to or lower than the allowable upper limit temperature, the reliability of the corresponding one of the first to fourth lower-arm switches S1*n* to S4*n* is maintained.

Upon determination that the switch temperature Tsw1 is higher than the third threshold Tth3 and equal to or lower than the fourth threshold Tth4 (YES in step S16), the controller 30 determines that the switch temperature Tsw1 calculated in the present drive routine belongs to the fourth determination temperature range. Then, the drive routine proceeds to step S17.

In step S17, the controller 30 serves as, for example, the selector 30b to select all the first to fourth drivers 41 to 44. Then, in step S17, the controller 30 serves as, for example, the power-supply controller 30d to cause all the first to fourth power supply circuits 51 to 54 to supply the constant voltages to all the first to fourth drivers 41 to 44. This results in the first to fourth drivers 41 to 44 being activated, so that the first to fourth lower-arm switches S1n to S4n are each selected as a drive target switch.

Specifically, in step S17, the controller 30 serves as, for example, the drive controller 30c to control the first to fourth drivers 41 to 44 via the first to fourth power supply circuits 51 to 54 to 1. Turn on the first lower-arm switch S1n during the on duration Lon of the drive pulse D1 and turn off the first lower-arm switch S1n after lapse of the on duration Lon every four reference switching cycles, expressed as (4×Lsw) (see FIG. 6)

2. Turn on the second lower-arm switch S2n during the on duration Lon of the drive pulse D2 and turn off the second lower-arm switch S2n after lapse of the on duration Lon every four switching cycles (4×Lsw) while keeping one reference switching cycle Law between the on start timing of each drive pulse D1 and the on start timing of the drive pulse D2 adjacent to the corresponding drive pulse D1 (see FIG. 6)

3. Turn on the third lower-arm switch S3n during the on duration Lon of the drive pulse D3 and turn off the third lower-arm switch S3n after lapse of the on duration Lon every four switching cycles (4×Lsw) while keeping one reference switching cycle Lsw between the on start timing of each drive pulse D2 and the on start timing of the drive pulse D3 adjacent to the corresponding drive pulse D2 (see FIG. 6)

4. Turn on the fourth lower-arm switch S4n during the on duration Lon of the drive pulse D4 and turn off the fourth lower-arm switch S4n after lapse of the on duration Lon every four switching cycles (4×Lsw) while keeping one reference switching cycle Lsw between the on start timing of each drive pulse D3 and the on start timing of the drive pulse D4 adjacent to the corresponding drive pulse D3 (see FIG. 6)

In other words, the controller 30 alternately turns on the first lower-arm switch S1n, the second lower-arm switch S2n, the third lower-arm switch S3n, and the fourth lower-arm switch S4n every fourth reference switching cycles (4×Lsw), so that the on duration of the first lower-arm switch S1n, the on duration of the second lower-arm switch S2n, the on duration a the third lower-arm switch S3n, and the on duration of the four lower-arm switch S4n are nonoverlapped with each other.

Otherwise, upon determination that the switch temperature Tsw1 is higher than the fourth threshold Tth4 (NO in step S16), the controller 30 determines that the switch temperature Tsw1 calculated in the present drive routine has exceeded the fourth threshold serving as, for example, a temperature threshold. Then, the drive routine proceeds to step S18.

In step 818, the controller 30 serves as, for example, the power-supply controller 30d to cause all the first to fourth power supply circuits 51 to 54 to supply the constant voltages to all the first to fourth drivers 41 to 44. This results in the first to fourth drivers 41 to 44 being activated, so that the first to fourth lower-arm switches S1n to S4n are each selected as a drive target switch.

Specifically, in step S18, the controller 30 serves as, for example, the drive controller 30c to control the first to fourth drivers 41 to 44 via the first to fourth power supply circuits 51 to 54 to 1. Turn on a pair of the first and second lower-arm switches S1n and S2n during the respective identical on durations Lon of the drive pulses D1 and D2 and turn off the pair of the first and second lower-arm switches S1n and S2n after lapse of the on durations Lon every two reference switching cycles, expressed as (2×Lsw) (see FIG. 7)

2. Turn on a pair of the third and fourth lower-arm switches S3n and S4n during the respective identical on durations Lon of the drive pulses D3 and D4 and turn off the pair of the third and fourth lower-arm switches S3n and S4n after lapse of the on durations Lon every two reference switching cycles, expressed as (2×Lsw) while keeping one reference switching cycle Lsw between the on start timing of each drive pulse D1, D2 and the on start timing of the drive pulse D3, D4 adjacent to the corresponding drive pulse D1, D2

In other words, the controller 30 alternately turns on the pair, i.e. the first group, of first and second lower-arm switches S1n and S2n and the pair, i.e. the second group, of third and fourth lower-arm switches S3n and S4n every two reference switching cycles (2×Lsw), so that the on durations of the first group of first and second lower-arm switches S1n and S2n and the on durations of the second group of third and fourth lower-arm switches S3n and S4n are nonoverlapped with each other. Note that the on duration for the first group of first and second lower-arm switches S1n and S2n and the on duration for the second group of third and fourth lower-arm switches S3n and S4n are for example set to be identical to each other.

That is, the operation in step S18 enables a current based on the power source PS to be distributed to flow through both the first and second lower-arm switches S1n and S2n every two reference switching cycles (2×Lsw). This reduces the level of the current flowing through each of the first and second switches S1n and S2n based on the operation in step S18 as compared with the level of a current flowing through each of the first and second switches S1n and S2n based on the operation in step S17. This therefore enables the switch temperature Tsw1 of the first lower-arm switch S1n to be equal to or lower than the fourth threshold Tth4, resulting in lower conduction loss of at least the first lower-arm switch S1n.

The following describes an example of how the first to fourth switches are driven in, accordance with the present drive routine illustrated in FIG. 2. In the following example, it is assumed that the determination in step S12 in the previous drive routine has been affirmative.

If the determination in step S12 is changed to be negative in the present drive routine, and the determination in step S14 is affirmative in the present drive routine, the drive target switches are changed from the first and second lower-arm switches S1n and S2n to the first to third lower-arm switches S1n to S3n (see step S15). This increases the number of the drive target switches by one switch.

On the other hand, if the determination in step S10 is changed to be affirmative in the present drive routine, the drive target switches are changed from the first and second lower-arm switches S1n and S2n to the first lower-arm switch S1n (see step S11). This reduces the number of the drive target switches by one switch.

Otherwise, if the determination in step S12 is also affirmative in the present drive routine, the number of the drive target switches is kept unchanged, because it is determined that the determination temperature range to which the switch temperature Tsw1 belongs is unchanged.

The power conversion system CS according to the first embodiment described above is configured to adjust the frequency of the first lower-arm switch S1n to be alternately turned on and off in accordance with the switch temperature Tsw1 of the first lower-arm switch S1n. That is, this configuration increases the number of drive target switches to thereby reduce the frequency of on-off operations of the first lower-arm switch S1n if the switch temperature Tsw1 of the first lower-arm switch S1n increases.

Figure 8:
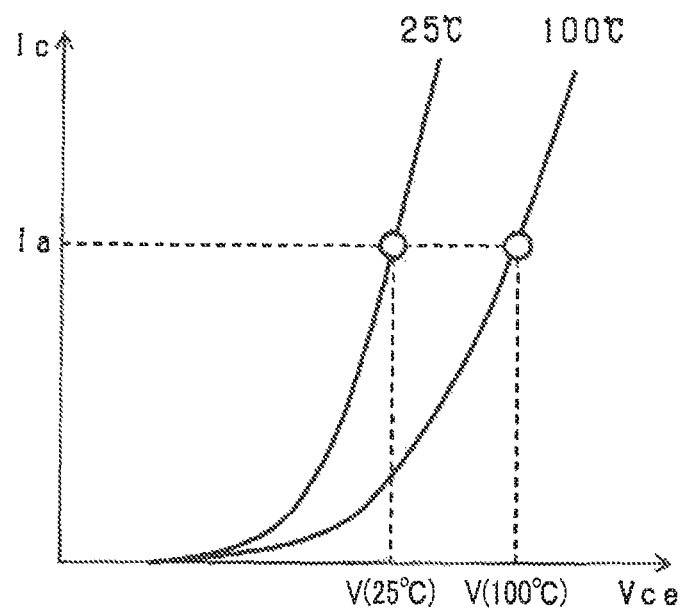
FIG. 8 is a graph schematically illustrating an example of the relationship between a collector current flowing through an IGBT and the collector-emitter voltage across the IGBT.
Figure 9:
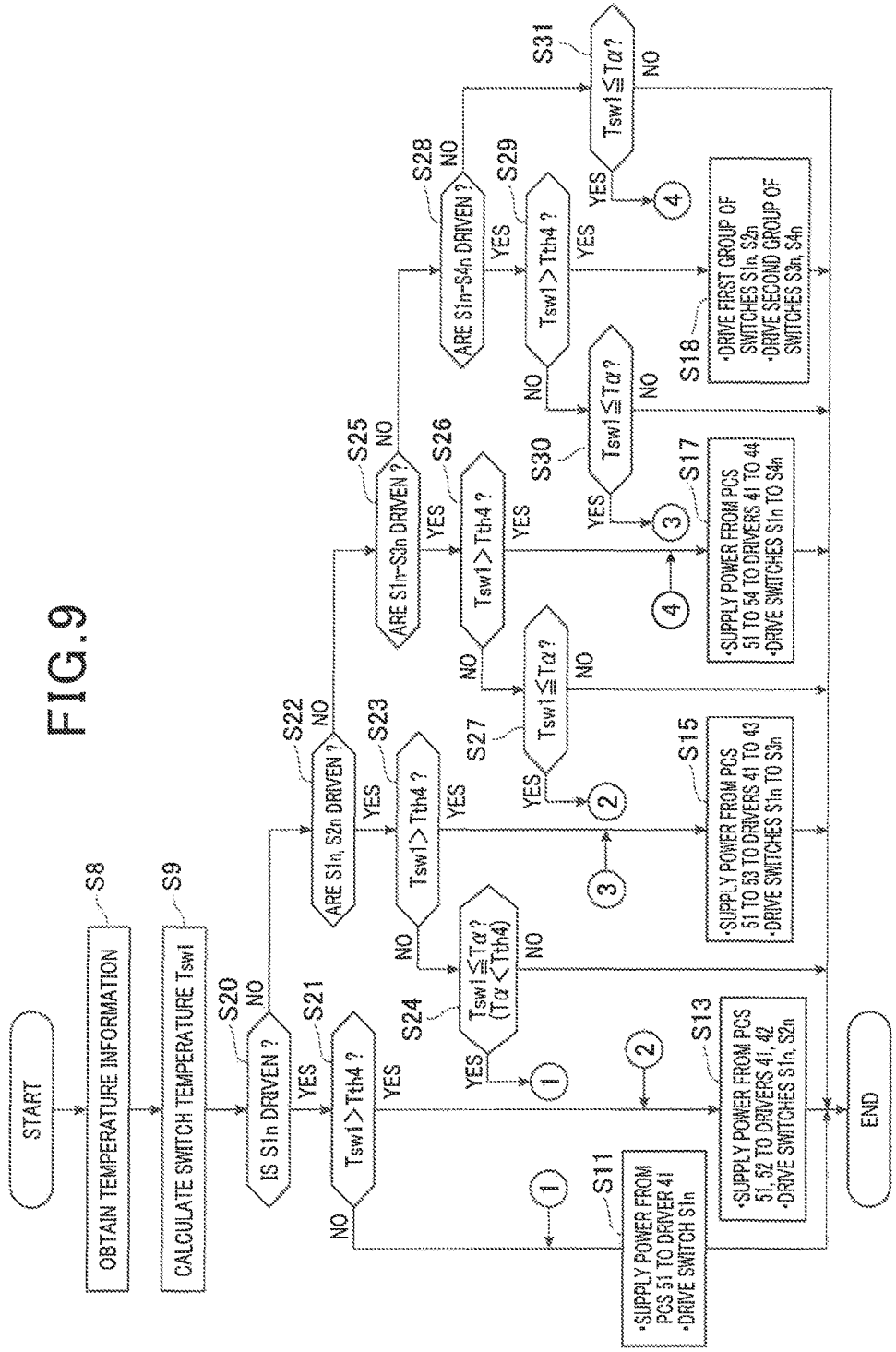
FIG. 9 is a flowchart schematically illustrating a drive routine carried out by a controller of a power conversion system according to the second embodiment of the present disclosure.

That is, as illustrated in FIG. 8, when a collector current Ic flowing through an IGBT has a value Ia, the collector-emitter voltage Vce across the IGBT is changed between a value V(25° C.) and a value V(100° C.) depending on change of the temperature of the IGBT between 25° C. and 100° C. That is, FIG. 9 shows that the on resistance of the IGBT has temperature dependency.

Preventing an increase of the temperature of the first lower-arm switch S1n as a specified switch therefore reduces the on resistance of the first lower-arm switch S1n, resulting in reduction of conduction loss of the first lower-arm switch S1n. This therefore reduces the total loss in the booster converter 10.

In addition, the power conversion system CS according to the first embodiment is configured to selectively energize at least one of the first to fourth drivers 41 to 44, which corresponds to at least one drive target switch. This configuration therefore results in lower power consumption of the power conversion system. CS while holding down an increase of the temperature of the first lower-arm switch S1n.

Second Embodiment

The following describes a power conversion system according to the second embodiment of the present disclosure with reference to FIG. 9. The configuration and functions of the power conversion system according to the second embodiment are mainly different from those of the power conversion system CS according to the first embodiment by the following points. The following therefore mainly describes the different points while like reference numerals are assigned to like parts between the first and second embodiments.

The following describes a drive routine for the first to fourth lower-arm switches S1n to S4n in the booster mode with reference to FIG. 9. The controller 30 is programmed to perform the drive routine in, for example, a predetermined period. Like steps between the drive routine illustrated in FIG. 9 and the drive routine illustrated in FIG. 2, to which like step numbers are assigned, are omitted or simplified in description.

When starting the drive routine, the controller 30 performs the operations in steps S8 and S9, and serves as, for example, the selector 30b to determine whether the first lower-arm switch S1n in the first to fourth lower-arm switches S1n to S4n is only selected as the at least one drive target switch in step S20.

Upon determination that the first lower-arm switch S1n in the first to fourth lower-arm switches S1n to S4n is only selected as the at least one drive target switch (YES in step S20), the controller 30 serves as, for example, the selector 30b to determine whether the switch temperature Tsw1 calculated in the present drive routine is higher than the fourth threshold Tth4 in step S21. The operation in step S21 aims to determine whether there is a temperature situation in which an increase of the number of the drive target switches is required.

Upon determination that the switch temperature Tsw1 calculated in the present drive routine is equal to or lower than the fourth threshold Tth4 (NO in step S21), the controller 30 determines that there is not a temperature situation in which an increase of the number of the drive target switches is required. Then, the drive routine proceeds to step S11.

In step S11, as described above, the controller 30 selects, from the first to fourth drivers 41 to 44, the first driver 41, and causes the first power supply circuit 51 to supply the constant voltage to only the selected first driver 41. This results in the first driver 41 being activated, so that the first lower-arm switch S1n is selected as a drive target switch. Then, the controller 30 controls the first driver 41 via the first power supply circuit 51 to turn on only the first lower-arm switch S1n during the on duration Lon and turn off the first lower-arm switch S1n after lapse of the on duration Lon in each reference switching cycle Lsw (see FIG. 3).

Otherwise, upon determination that the switch temperature Tsw1 calculated in the present drive routine is higher than the fourth threshold Tth4 (YES in step S21), the controller 30 determines that there is a temperature situation in which an increase of the number of the drive target switches is required. Then, the drive routine proceeds to step S13.

In step S13, as described above, the controller 30 selects, from the first to fourth drivers 41 to 44, the first and second drivers 41 and 42, and causes the first and second power supply circuits 51 and 52 to supply the constant voltages to only the selected first and second drivers 41 and 42. This results in the first and second drivers 41 and 42 being activated, so that the first and second lower-arm switches S1n and S2n are each selected as a drive target switch.

Figure 4:
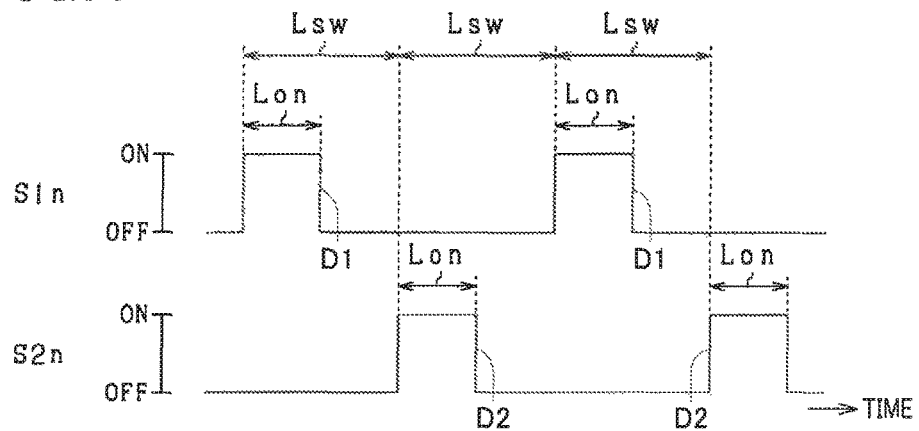
FIG. 4 is a timing chart schematically illustrating how first and second lower-arm switches are driven over time.

Specifically, as illustrated in FIG. 4, the controller 30 alternately turns on the first lower-arm switch S1n and the second lower-arm switch S2n every two reference switching cycles (2×Lsw), so that the on duration of the first lower-arm switch S1n is nonoverlapped with the on duration of the second lower-arm switch S2n.

Otherwise, upon determination that not only the first lower-arm switch S1n in the first to fourth lower-arm switches S1n to S4n is selected as the at least one drive target switch (NO in step S20), the controller 30 serves as, for example, the selector 30b to determine whether only the first and second lower-arm switches S1n and S2n selected in step S13 are driven as the drive target switches in step S22.

Upon determination that only the first and second lower-arm switches S1n and S2n selected in step S13 are driven as the drive target switches (YES in step S22), the controller 30 serves as, for example, the selector 30b to determine whether the switch temperature Tsw1 is higher than the fourth threshold Tth4 in step S23.

Upon determination that the switch temperature Tsw1 is equal to or lower than the fourth threshold Tth4 (NO in step S23), the controller 30 serves as, for example, the selector 30b to determine whether the switch temperature Tsw1 is equal to or lower than a predetermined reference temperature Tα that is set to be lower than the fourth threshold Tth4 in step S24. The operation in step S24 aims to determine whether there is a temperature situation in which a decrease of the number of the drive target switches is permitted.

Upon determination that the switch temperature Tsw1 is higher than the predetermined reference temperature Tα (NO in step S24), the controller 30 determines that there is not a temperature situation in which a decrease of the number of the drive target switches is permitted. Then, the controller 30 terminates the drive routine, so that the first and second lower-arm switches S1n and S2n are continuously driven as the drive target switches (see step S13).

Otherwise, upon determination that the switch temperature Tsw1 is equal to or lower than the predetermined reference temperature Tα (YES in step S24), the controller 30 determines that there is a temperature situation in which a decrease of the number of the drive target switches is permitted. Then, the drive routine proceeds to step S11, and the controller 30 performs the operation in step S11, so that the target drive switches are reduced from the first and second lower-arm switches S1n and S2n to the first lower-arm switch S1n.

Otherwise, upon determination that the switch temperature Tsw1 is higher than the fourth threshold Tth4 (YES in step S23), the controller 30 determines that there is a temperature situation in which an increase of the number of the drive target switches is required. Then, the drive routine proceeds to step S15.

In step S15, as described above, the controller 30 selects, from the first to fourth drivers 41 to 44, the first to third drivers 41 to 43, and causes the first to third power supply circuits 51 to 53 to supply the constant voltages to only the selected first to third drivers 41 to 43. This results in the first to third drivers 41 to 43 being activated, so that the first to third lower-arm switches S1n to S3n are each selected as a drive target switch.

Figure 5:
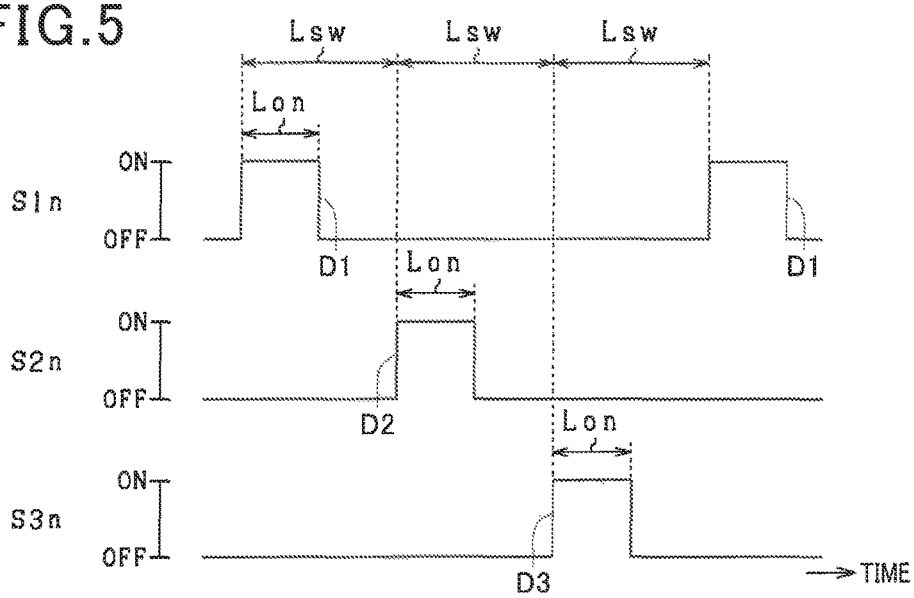
FIG. 5 is a timing chart schematically illustrating how first to third lower-arm switches are driven over time.

In other words, the controller 30 alternately turns on the first lower-arm switch S1n, the second lower-arm switch S2n, and the third lower-arm switch S3n every three reference switching cycles (3×Lsw), so that the on duration of the first lower-arm switch S1n, the on duration of the second lower-arm switch S2n, and the on duration of the third lower-arm switch S3n are nonoverlapped with each other (see FIG. 5).

Otherwise, upon determination that not only the first and second lower-arm switches S1n and S2n selected in step S13 are driven as the drive target switches (NO in step S22), the controller 30 serves as, for example, the selector 30b to determine whether the first to third lower-arm switches S1n to S3n selected in step S15 are only driven as the drive target switches in step S25.

Upon determination that the first to third lower-arm switches S1n to S3n selected in step S15 are only driven as the drive target switches (YES in step S25), the controller 30 determines whether the switch temperature Tsw1 is higher than the fourth threshold Tth4 in step S26.

Upon determination that the switch temperature Tsw1 is equal to or lower than the fourth threshold Tth4 (NO in step S26), the controller 30 serves as, for example, the selector 30b to determine whether the switch temperature Tsw1 is equal to or lower than the predetermined reference temperature Tα in step S27.

Upon determination that the switch temperature Tsw1 is higher than the predetermined reference temperature Tα (NO in step S27), the controller 30 determines that there is not a temperature situation in which a decrease of the number of the drive target switches is permitted. Then, the controller 30 terminates the drive routine, so that the first to third lower-arm switches S1n to S3n are continuously driven as the drive target switches (see step S15).

Otherwise, upon determination that the switch temperature Tsw1 is equal to or lower than the predetermined reference temperature Tα (YES in step S27), the controller 30 determines that there is a temperature situation in which a decrease of the number of the drive target switches is permitted. Then, the drive routine proceeds to step S13, and the controller 30 performs the operation in step S13, so that the target drive switches are reduced from the first to third lower-arm switches S1n to S3n to the first and second lower-arm switches S1n and S2n.

Otherwise, upon determination that the switch temperature Tsw1 is higher than the fourth threshold Tth4 (YES in step S26), the controller 30 determines that there is a temperature situation in which an increase of the number of the drive target switches is required. Then, the drive routine proceeds to step S17.

In step S17, as described above, the controller 30 causes all the first to fourth power supply circuits 51 to 54 to supply the constant voltages to all the first to fourth drivers 41 to 44. This results in the first to fourth drivers 41 to 44 being activated, so that the first to fourth lower-arm switches S1n to S4n are each selected as a drive target switch.

Figure 6:
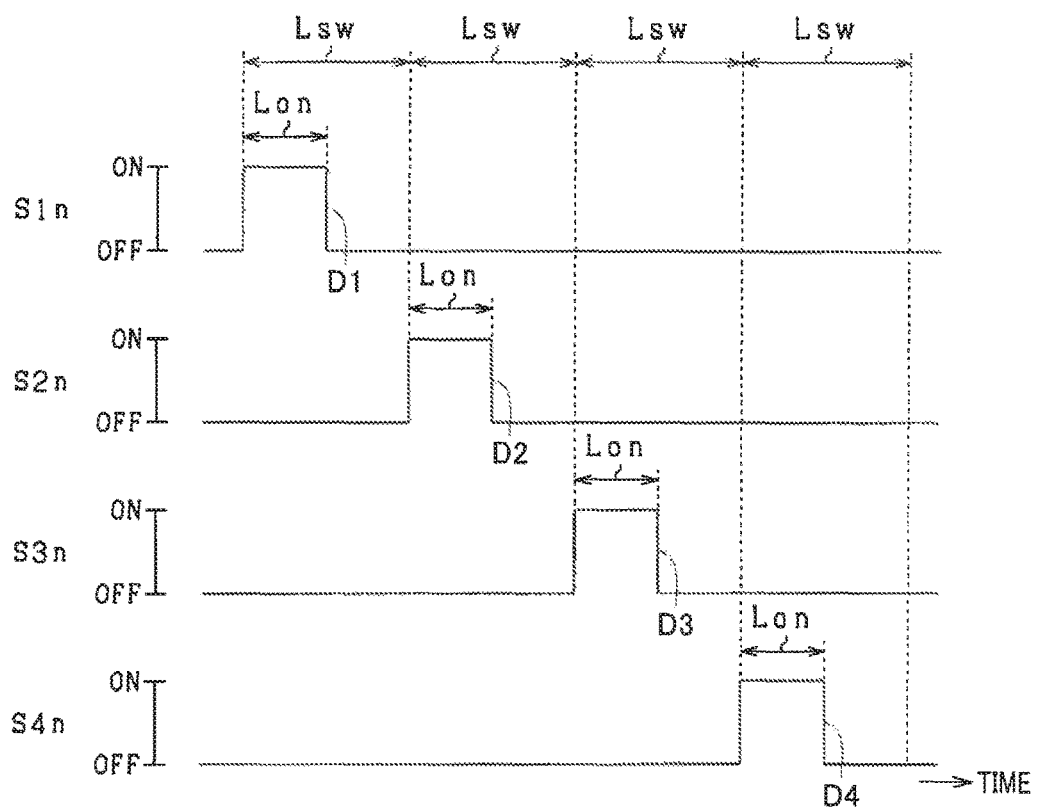
FIG. 6 is a timing chart schematically illustrating how first to fourth lower-arm switches are driven over time.

Specifically, the controller 30 alternately turns on the first lower-arm switch S1n, the second lower-arm switch S2n, the third lower-arm switch S3n, and the fourth lower-arm switch S4n every fourth reference switching cycles (4×Lsw), so that the on duration of the first lower-arm switch S1n, the on duration of the second lower-arm switch S2n, the on duration of the third lower-arm switch S3n, and the on duration of the four lower-arm switch S4n are nonoverlapped with each other (see FIG. 6).

Otherwise, upon determination that not only the first to third lower-arm switches S1n to S3n selected in step S15 are driven as the drive target switches (NO in step S25), the controller 30 serves as, for example, the selector 30b to determine whether the first to fourth lower-arm switches S1n to S4n selected in step S17 are only driven as the drive target switches in step S28.

Upon determination that the first to fourth lower-arm switches S1n to S4n selected in step S17 are only driven as the drive target switches (YES in step S28), the controller 30 serves as, for example, the selector 30b to determine whether the switch temperature Tsw1 is higher than the fourth threshold Tth4 in step S29.

Upon determination that the switch temperature Tsw1 is equal to or lower than the fourth threshold Tth4 (NO in step S29), the controller 30 determines whether the switch temperature Tsw1 is equal to or lower than the predetermined reference temperature Tα in step S30.

Upon determination that the switch temperature Tsw1 is higher than the predetermined reference temperature Tα (NO in step S30), the controller 30 determines that there is not a temperature situation in which a decrease of the number of the drive target switches is permitted. Then, the controller 30 terminates the drive routine, so that the first to fourth lower-arm switches S1n to S4n are continuously driven as the drive target switches (see step S17).

Otherwise, upon determination that the switch temperature Tsw1 is equal to or lower than the predetermined reference temperature Tα (YES in step S30), the controller 30 determines that there is a temperature situation in which a decrease of the number of the drive target switches is permitted. Then, the drive routine proceeds to step S15, and the controller 30 performs the operation in step S15, so that the target drive switches are reduced from the first to fourth lower-arm switches S1n to S4n to the first to third lower-arm switches S1n to S3n.

Otherwise, upon determination that the switch temperature Tsw1 is higher than the fourth threshold Tth4 (YES in step S29), the drive routine proceeds to step S18.

In step S18, as described above, the controller 30 causes all the first to fourth power supply circuits 51 to 54 to supply the constant voltages to all the first to fourth drivers 41 to 44. This results in the first to fourth drivers 41 to 44 being activated, so that the first to fourth lower-arm switches S1n to S4n are each selected as a drive target switch.

Figure 7:
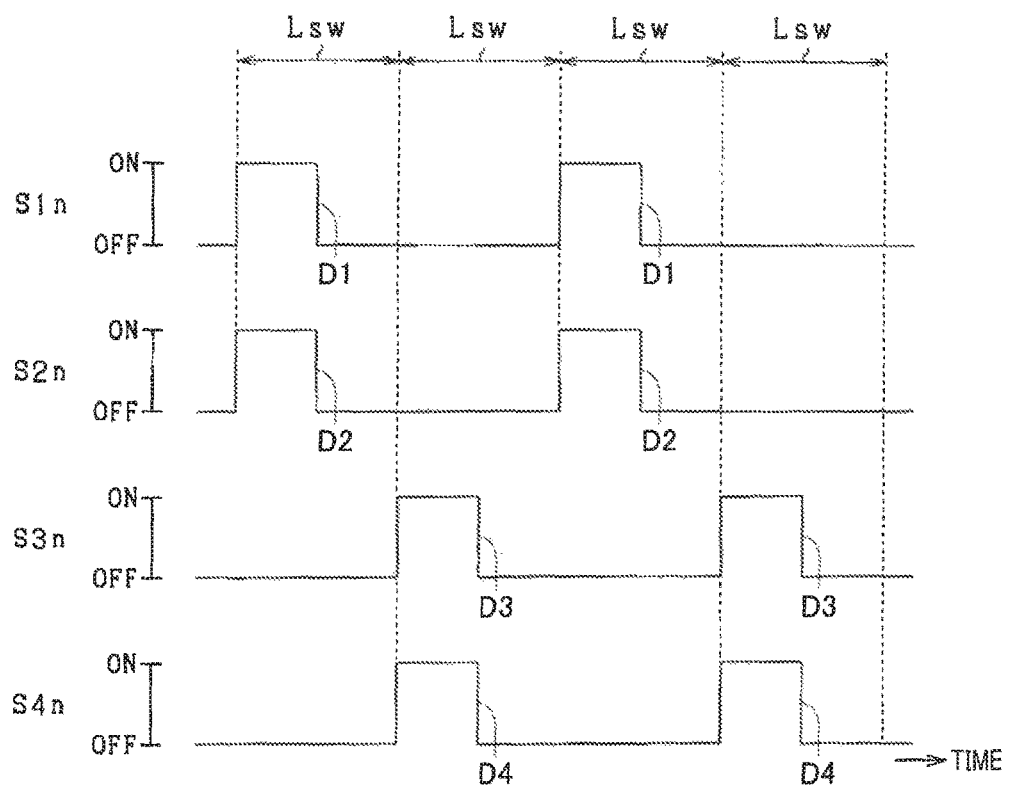
FIG. 7 is a timing chart schematically illustrating how the first and second lower-arm switches of a first group and the third and fourth lower-arm switches of a second group are driven over time.

Specifically, the controller 30 alternately turns on the pair, i.e. the first group, of first and second lower-arm switches S1n and S2n and the pair, i.e. the second group, of third and fourth lower-arm switches S3n and S4n every two reference switching cycles (2×Lsw), so that the on durations of the first group of first and second lower-arm switches S1n and S2n and the on durations of the second group of third and fourth lower-arm switches S3n and S4n are nonoverlapped with each other (see FIG. 7).

Otherwise, upon determination that not only the first to fourth lower-arm switches S1n to S4n selected in step S17 are driven as the drive target switches (NO in step S28), the controller 30 determines that the pair of first and second lower-arm switches S1n and S2n and the pair of the third and fourth lower-arm switches S3n and S4n selected in step S18 are is being driven as the drive target switches. Then, the drive routine proceeds to step S31.

In step S31, the controller 30 determines whether the switch temperature Tsw1 is equal to or lower than the predetermined reference temperature Tα.

Upon determination that the switch temperature Tsw1 is higher than the predetermined reference temperature Tα (NO in step S31), the controller 30 terminates the drive routine, so that the pair of first and second lower-arm switches S1n and S2n and the pair of the third and fourth lower-arm switches S3n and S4n selected in step S18 are continuously driven as the drive target switches.

Otherwise, upon determination that the switch temperature Tsw1 is equal to or lower than the predetermined reference temperature Tα (YES in step S31), the drive routine proceeds to step S17. In step S17, the controller 30 performs the operation in step S17, so that the first to fourth lower-arm switches S1n to S4n are driven in step S17 as described above.

The power conversion system according to the second embodiment described above is configured to 1. Increase the number of the drive target switches to thereby reduce the frequency of on-off operations of the first lower-arm switch S1n if the switch temperature Tsw1 of the first lower-arm switch S1n increases 2. Continuously use each of the lower-arm switches S1n to S4n selected as the target drive switches until the switch temperature Tsw1 reaches the fourth threshold Tth4. This configuration therefore prevents an increase of the temperature of the first lower-arm switch S1n as a specified switch while holding down an increase of the number of the drive target switches, resulting in reduction of conduction loss of each of the first to fourth lower-arm switches S1n to S4n.

The present disclosure is not limited to the aforementioned embodiments, and can be modified within the scope thereof, The number of lower-arm switches is not limited to four, can be set to two, three, five or more.

If there are first to sixth lower-arm switches S1n to S6n provided in the power conversion system, and when the controller 30 performs the drive routine illustrated in FIG. 2, the first to sixth lower-arm switches S1n to S6n are driven by the operation in step S18 of the drive routine. Note that there are first to sixth drivers and first to sixth power supply circuits provided in the power conversion system for the respective first to sixth lower-arm switches S1n to S6n.

Figure 10:
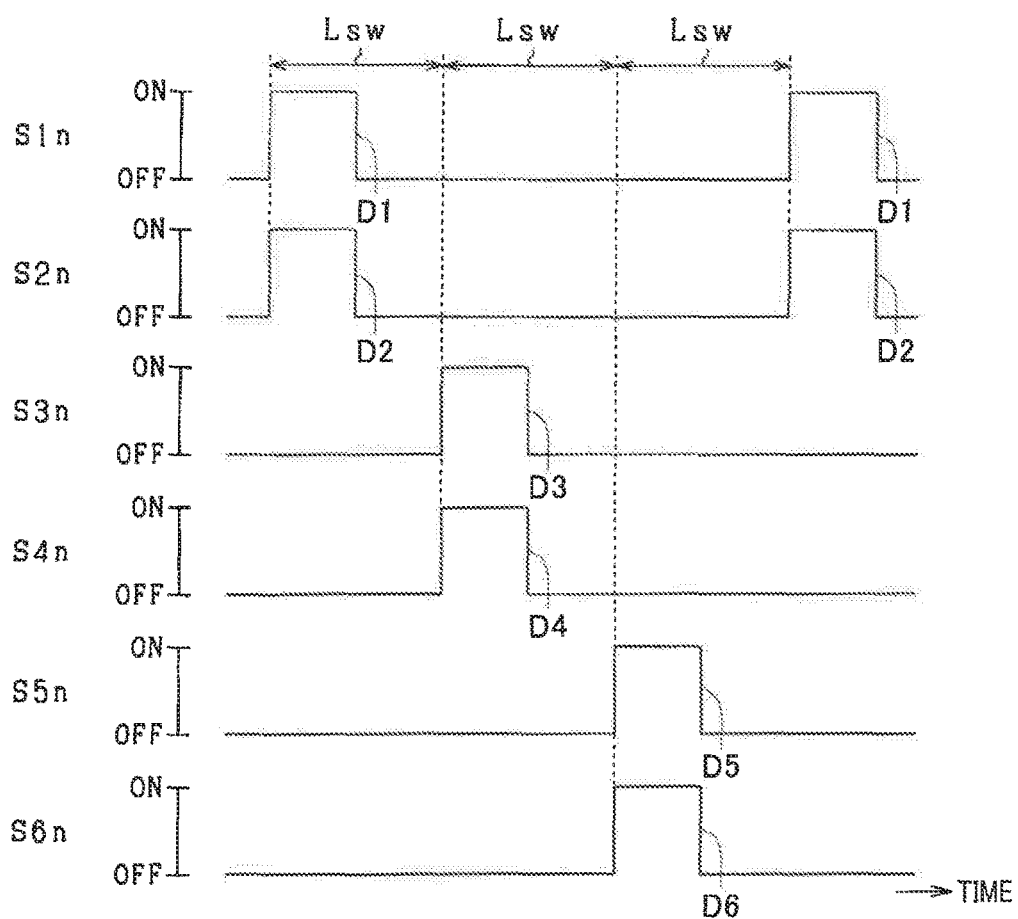
FIG. 10 is a timing chart schematically illustrating how the first and second lower-arm switches of the first group, the third and fourth lower-arm switches of the second group, and fifth and sixth lower-arm switches are driven over time according to a modification of each embodiment.

Specifically, the controller 30 controls the first to sixth drivers via the first to sixth power supply circuits to 1. Turn on a pair of the first and second lower-arm switches S1n and 82n during the respective identical on durations Lon of the drive pulses D1 and D2 and turn off the pair of the first and second lower-arm switches S1n and S2n after lapse of the on durations Lon every three reference switching cycles, expressed as (3×Lsw) (see FIG. 10)

2. Turn on a pair of the third and fourth lower-arm switches S3n and S4n during the respective identical on durations Lon of the drive pulses D3 and D4 and turn off the pair of the third and fourth lower-arm switches S3n and S4n after lapse of the on durations Lon every three reference switching cycles, expressed as (3×Lsw) while keeping one reference switching cycle Lsw between the on start timing of each drive pulse D1, D2 and the on start timing of the drive pulse D3, D4 adjacent to the corresponding drive pulse D1, D2

3. Turn on a pair of the fifth and sixth lower-arm switches S5n and S6n during the respective identical on durations Lon of the drive pulses D5 and D6 and turn off the pair of the fifth and sixth lower-arm switches S5n and S6n after lapse of the on durations Lon every three reference switching cycles, expressed as (3×Lsw) while keeping one reference switching cycle Lsw between the on start timing of each drive pulse D3, D4 and the on start timing of the drive pulse D5, D6 adjacent to the corresponding drive pulse D3, D4

In other words, the controller 30 alternately turns on the pair, i.e. the first group, of first and second lower-arm switches S1n and S2n, the pair, i.e, the second group, of third and fourth lower-arm switches S3n and S4n, and the pair, i.e. the third group, of fifth and sixth lower-arm switches S5n and S6n every three reference switching cycles (3×Lsw), so that the on durations of the first group of first and second lower-arm switches S1n and S2n, the on durations of the second group of third and fourth lower-arm switches S3n and S4n, and the on durations of the third group of fifth and sixth lower-arm switches S5n and S6n are nonoverlapped with each other. Note that the on duration for the first group of first and second lower-arm switches S1n and S2n, the on duration for the second group of third and fourth lower-arm switches S3n and S4n, and the on duration for the third group of fifth and sixth lower-arm switches S5n and S6n are for example set to be identical to each other.

Each of the first and second embodiments is configured such that the minimum number of lower-arm switches selected as at least one drive target switch is set to 1, but can be set to 2 or more provided that the number of lower-arm switches is two or more.

In FIG. 7, the on duration of one of the first and second lower-arm switches S1n and S2n in the first group can be set to be shorter than the on duration of the other thereof. This modification also enables a current based on the power source PS to be distributed to flow through both the first and second lower-arm switches S1n and S2n during the first and second lower-arm switches S1n and S2n being both in the on state. This therefore reduces the level of the current flowing through the first and switches S1n and S2n, resulting in lower conduction loss of each of the first and second lower-arm switches S1n and S2n.

Similarly, in FIG. 7, the on duration of one of the third and fourth lower-arm switches S3n and S4n in the second group can be set to be shorter than the on duration of the other thereof.

The temperature sensor 20 is provided for the first lower-arm switch S1n selected from the first to fourth lower-arm switches S1n to S4n, but the present disclosure is not limited thereto. Specifically, first to fourth temperature sensors can be provided for the respective first to fourth lower-arm switches S1n to S4n. In this modification, the controller 30 can select the highest temperature in the temperatures of the first to fourth lower-arm switches S1n to S4n measured by the first to fourth temperature sensors as the switch temperature Tsw1 in each of the drive routines illustrated in FIGS. 2 and 9.

The temperature sensor 20 can be comprised of another temperature-sensitive device, such as a thermistor.

The booster converter 10 can be operative to step down an output voltage from the positive and negative output terminals Cop and Con, and output the stepped-down voltage to the positive and negative input terminals Cip and Cin.

Specifically, the controller 30 can perform a feedback control task in a step-down mode to perform on on-off control of the first to fourth upper-arm switches S1p to S4p while maintaining the first to fourth lower-arm switches S1n to S4n in the off state. This feedback control task in the step-down mode causes the stepped-down voltage to follow a target voltage. That is, in the step-down mode, the controller 30 performs one of the drive routine illustrated in FIG. 2 and the drive routine illustrated in FIG. 9 when controlling the first to fourth upper-arm switches S1p to S4p.

The first to fourth upper-arm switches S1p to S4p and the first to fourth lower-arm switches S1n to S4n, which constitute the booster converter 10 can be cooled by a coolant circulated in an unillustrated cooler. In this modification, the controller 30 can obtain the temperature of the coolant as a temperature parameter indicative of the temperature of one of the first to fourth lower arm switches S1n to S4n in place of the switch temperature Tsw1; the temperature of the coolant has a positive correlation with the temperature of the first lower-arm switch S1n. Similarly, the controller 30 can obtain the flow rate of the coolant as a temperature parameter indicative of the temperature of one of the first to fourth lower arm switches S1n to S4n in place of the switch temperature Tsw1 the flow rate of the coolant has a negative correlation with the temperature of the first lower-arm switch S1n.

Each of the first and second embodiments uses the booster converter 10 comprised of a plurality of switches as a power converter, but can use another type of power converters operative to convert an input voltage into a predetermined output voltage, such as an inverter for converting an input DC voltage into a predetermined alternating-current (AC) voltage, or a step-down DC-DC converter.

As described above, MOSFETs, such as N-channel MOSFETs, can be used as the respective switches of the booster converter 10 according to each embodiment. Each of the power conversion systems according to the first and second embodiments can be installed in another machine except for a vehicle.

While the illustrative embodiments and their modifications of the present disclosure have been described herein, the present disclosure is not limited to the embodiments and their modifications described herein. Specifically, the present disclosure includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driving apparatus for a plurality of switches connected in parallel to each other, the driving apparatus comprising:
    a plurality of drivers configured to turn on or off the respective switches;
    a temperature obtainer configured to obtain a value of a temperature parameter correlating with a temperature of at least one of the switches;
    a selector configured to select at least one of the switches as at least one drive target switch; and
    a drive controller configured to cause at least one of the drivers to:
       turn on the at least one target switch during a predetermined on duration and thereafter turn off the at least one target switch in each target switching cycle, the target switching cycle being defined as a product of a reference switching cycle and the number of the selected at least one target switch,
    the selector being configured to adjust the number of the selected at least one drive target switch in accordance with the value of the temperature parameter.

2. The driving apparatus according to claim 1, wherein:
    the drivers comprise at least first and second drivers;
    the selector is configured to:
       select a first switch, and a second switch in the switches as first and second drive target switches constituting the at least one drive target switch; and
    the drive controller is configured to:
       cause the first driver to:
          turn on the first drive target switch during a predetermined first on duration as the on duration and thereafter turn off the first drive target switch in each target switching cycle; and
       cause the second driver to:
          turn on the second drive target switch during a predetermined second on duration as the on duration and thereafter turn off the second drive target switch in each target switching cycle such that the first on duration of the first drive target switch is nonoverlapped with the second on duration of the second drive target switch.

3. The driving apparatus according to claim 1, wherein:
    the selector is configured to:
       determine whether the value of the temperature parameter is higher than a temperature threshold; and
       increase the number of the selected at least one drive target switch upon determination that the value of the temperature parameter is higher than the temperature threshold.

4. The driving apparatus according to claim 3, wherein:
    the selector is configured to:
       determine whether the value of the temperature parameter is lower than a reference temperature, the reference temperature being set to be lower than the temperature threshold; and
       decrease the number of the selected at least one drive target switch upon determination that the value of the temperature parameter is equal to or lower than the reference temperature.

5. The driving apparatus according to claim 3, wherein:
    the switches comprise at least first, second, third, and fourth switches connected in parallel to each other;
    the at least first, second, third, and fourth switches are separated into a first group of the first and second switches, and a second group of the third and fourth switches;

the drivers comprise at least first, second, third, and fourth drivers;

the selector is configured, upon determination that the value of the temperature parameter is higher than the temperature threshold while the number of the selected at least one drive target switch has reached an upper limit, to:

select the first and second switches of the first group as first and second drive target switches, and the third and fourth switches of the second group as third and fourth drive target switches, the first to fourth drive target switches constituting the at least one drive target switch, the target switching cycle being defined as the product of the reference switching cycle and the number of the selected switches in each of the first and second groups; and the drive controller is configured to:

cause each of the first and second drivers to:

turn on the corresponding one of the first and second drive target switches during a corresponding one of the first and second on durations as the on duration and thereafter turn off the corresponding one of the first and second drive target switches in each target switching cycle; and cause each of the third and fourth drivers to:

turn on the corresponding one of the third and fourth drive target switches during a corresponding one of predetermined third and fourth on durations as the on duration and thereafter turn off the corresponding one of the third and fourth drive target switches in each target switching cycle while each of the first and second on durations of the first group is nonoverlapped with each of the third and fourth on durations of the second group.

6. The driving apparatus according to claim 4, wherein:

the switches comprise at least first, second, third, and fourth switches connected in parallel to each other;

the at least first, second, third, and fourth switches are separated into a first group of the first and second switches, and a second group of the third and fourth switches;

the drivers comprise at least first, second, third, and fourth drivers;

the selector is configured, upon determination that the value of the temperature parameter is higher than the temperature threshold while the number of the selected at least one drive target switch has reached an upper limit, to:

select the first and second switches of the first group as first and second drive target switches, and the third and fourth switches of the second group as third and fourth drive target switches, the first to fourth drive target switches constituting the at least one drive target switch, the target switching cycle being defined as the product of the reference switching cycle and the number of the selected switches in each of the first and second groups; and the drive controller is configured to:

cause each of the first and second drivers to:

turn on the corresponding one of the first and second drive target switches during a corresponding one of the first and second on durations as the on duration and thereafter turn off the corresponding one of the first and second drive target switches in each target switching cycle; and cause each of the third and fourth drivers to:

turn on the corresponding one of the third and fourth drive target switches during a corresponding one of predetermined third and fourth on durations as the on duration and thereafter turn off the corresponding one of the third and fourth drive target switches in each target switching cycle while each of the first and second on durations of the first group is nonoverlapped with each of the third and fourth on durations of the second group.

7. The driving apparatus according to claim 1, wherein:

a plurality of temperature ranges different from each other are defined as determination temperature ranges; and the selector is configured to:

periodically perform a determination task that determines one of the determination temperature ranges to which the value of the temperature parameter belongs;

determine whether one of the determination temperature ranges to which the value of the temperature parameter belongs determined in a current determination task is higher than one of the determination temperature ranges to which the value of the temperature parameter belongs determined in a previous determination task;

increase the number of the selected at least one drive target switch upon determination that one of the determination temperature ranges to which the value of the temperature parameter belongs determined in the current determination task is higher than one of the determination temperature ranges to which the value of the temperature parameter belongs determined in the previous determination task; and decrease the number of the selected at least one drive target switch upon determination that one of the determination temperature ranges to which the value of the temperature parameter belongs determined in the current determination task is lower than one of the determination temperature ranges to which the temperature of one of the first and second switches belongs determined in the previous determination task.

8. The driving apparatus according to claim 7, wherein:

the switches comprise at least first, second, third, and fourth switches connected in parallel to each other;

the at least first, second, third, and fourth switches are separated into a first group of the first and second switches, and a second group of the third and fourth switches;

the drivers comprise at least first, second, third, and fourth drivers; and an upper limit of the highest temperature range in the determination temperature ranges is defined as the temperature threshold;

the selector is configured, upon determination that the value of the temperature parameter is higher than the temperature threshold, to:

select the first and second switches of the first group as first and second drive target switches, and the third and fourth switches of the second group as third and fourth drive target switches, the first to fourth drive target switches constituting the at least one drive target switch, the target switching cycle being defined as the product of the reference switching cycle and the number of the selected switches in each of the first and second groups; and the drive controller is configured to:

cause each of the first and second drivers to:

turn on the corresponding one of the first and second drive target switches during a corresponding one of the first and second on durations as the on duration and thereafter turn off the corresponding one of the first and second drive target switches in each target switching cycle; and cause each of the third and fourth drivers to:
turn on the corresponding one of the third and fourth drive target switches during a corresponding one of predetermined third and fourth on durations as the on duration and thereafter turn off the corresponding one of the third and fourth drive target switches in each target switching cycle while each of the first and second on durations of the first group is nonoverlapped with each of the third and fourth on durations of the second group.

9. The driving apparatus according to claim 1 further comprising:

a plurality of power supply circuits for supplying electrical power to the respective drivers; and a power-supply controller configured to cause at least one of the power supply circuits to supply the electrical power to only at least one of the drivers corresponding to the at least one drive target switch, wherein the drive controller is configured to:
cause the at least one of the drivers to which the electrical power is supplied from the at least one of the power supply circuits to turn on or turn off the corresponding at least one drive target switch.

\* \* \* \* \*